United States Patent
Lee et al.

(10) Patent No.: US 9,741,585 B1
(45) Date of Patent: Aug. 22, 2017

(54) REACTIVE RADICAL TREATMENT FOR POLYMER REMOVAL AND WORKPIECE CLEANING

(71) Applicant: Taiwan Semiconductor Manufacturing Co., Ltd., Hsin-Chu (TW)

(72) Inventors: Chung-Chieh Lee, Taipei (TW); Horng-Huei Tseng, Hsin Chu (TW); Chi-Ming Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/096,381

(22) Filed: Apr. 12, 2016

(51) Int. Cl.
| | |
|---|---|
| H01L 21/302 | (2006.01) |
| H01L 21/311 | (2006.01) |
| H01L 21/02 | (2006.01) |
| H01L 21/3115 | (2006.01) |
| H01L 21/3065 | (2006.01) |
| H01J 37/32 | (2006.01) |

(52) U.S. Cl.
CPC .. *H01L 21/31133* (2013.01); *H01J 37/32009* (2013.01); *H01L 21/0206* (2013.01); *H01L 21/3065* (2013.01); *H01L 21/31155* (2013.01); *H01J 2237/334* (2013.01)

(58) Field of Classification Search
CPC ............. H01L 21/312; H01L 21/31116; H01L 21/31127; H01L 21/31058; H01L 21/31138; H01L 21/32; H01L 21/30609; H01L 21/30608; H01L 21/3065

USPC ........ 438/706, 708, 709, 714, 725, 745, 762
See application file for complete search history.

(56) References Cited

U.S. PATENT DOCUMENTS

| | | | |
|---|---|---|---|
| 6,848,455 B1* | 2/2005 | Shrinivasan | B08B 3/08 134/1.3 |
| 2014/0007902 A1* | 1/2014 | Brown | H01L 21/67057 134/1.3 |
| 2014/0072653 A1* | 3/2014 | Buschmann | A01N 37/16 424/613 |
| 2015/0128991 A1* | 5/2015 | Brown | H01L 21/31133 134/1 |
| 2015/0357202 A1* | 12/2015 | Thedjoisworo | H01L 21/67069 438/725 |

OTHER PUBLICATIONS

Reinhart, et al. "Handbook of Cleaning for Semiconductor Manufacturing: Fundamentals and Applications." pp. 71-94. ISBN: 978-0-470-62595-8. Jan. 2011.
Reinhart, et al. "Handbook of Cleaning for Semiconductor Manufacturing: Fundamentals and Applications." pp. 211-214. ISBN: 978-0-470-62595-8. Jan. 2011.

* cited by examiner

*Primary Examiner* — Lan Vinh
(74) *Attorney, Agent, or Firm* — Eschweiler & Potashnik, LLC

(57) ABSTRACT

A method for removing polymer is provided. An aqueous solution is applied to a semiconductor workpiece with polymer arranged thereon. The aqueous solution comprises an energy receiver configured to generate reactive radicals in response to energy. Energy is applied to the aqueous solution to generate the reactive radicals in the aqueous solution and to remove the polymer. A process tool for generating the reactive radicals is also provided.

20 Claims, 14 Drawing Sheets

REACTIVE RADICAL TREATMENT FOR POLYMER REMOVAL AND WORKPIECE CLEANING

BACKGROUND

During the manufacture of integrated circuits (ICs), multi-step sequences of semiconductor manufacturing processes are performed to gradually form electronic circuits on semiconductor workpieces. The semiconductor manufacturing processes may include, for example, ion implantation, plasma etching, and polymer cleaning. Polymer cleaning is a process for removing polymer used by or otherwise resulting from other semiconductor manufacturing processes, such as, for example, ion implantation and plasma etching. The polymer may include, for example, ion implanted photoresist and/or fluorocarbon polymer. One type of polymer cleaning process commonly used to remove polymer during front-end-of-line (FEOL) manufacturing is a sulfuric acid-hydrogen peroxide mixture (SPM) cleaning process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
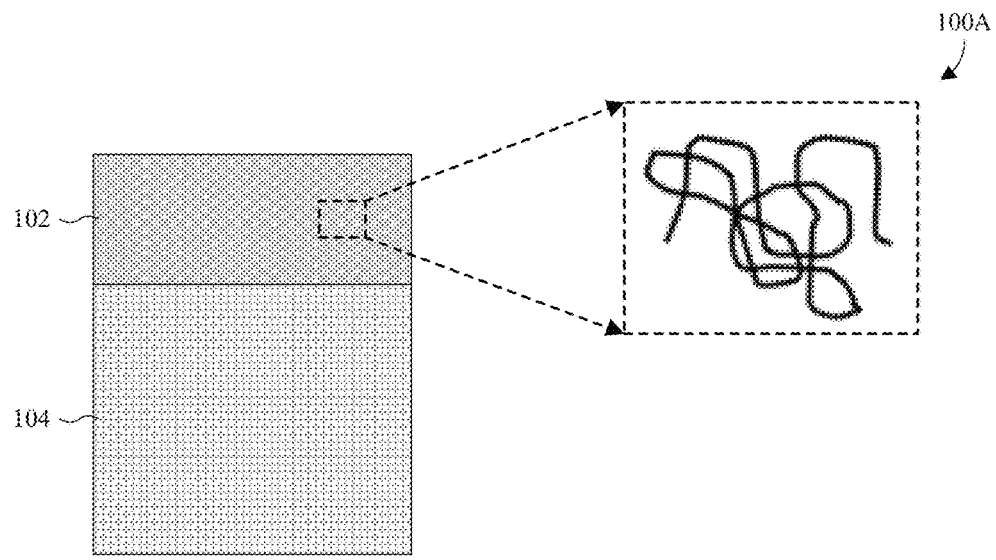
FIGS. 1A-1C illustrate a series of cross-sectional views of some embodiments of a method for removing polymer using reactive radicals.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some sulfuric acid-hydrogen peroxide mixture (SPM) cleaning processes for removing polymer from a workpiece comprise applying a mixture of sulfuric acid solution and hydrogen peroxide solution to the polymer at high temperatures and with high concentrations of sulfuric acid. The high temperatures may, for example, exceed 100 degrees Celsius, and/or the high concentrations of sulfuric acid may, for example, exceed 85 percent by mass (wt %) in the sulfuric acid solution. The high temperatures and the high concentrations of sulfuric acid dissolve or detach the polymer, and the sulfuric acid solution and the hydrogen peroxide solution react to produce Caro's acid (e.g., peroxymonosulfuric acid). The Caro's acid and/or the hydrogen peroxide then react with the dissolved or detached polymer to oxidize the the polymer and to convert the polymer to water and carbon dioxide.

A challenge with the SPM cleaning processes is high thermal stress. Certain polymers, such as ion-implanted photoresist, induce stress on features under manufacture, such as fins of fin field-effect transistors (finFETs), and the high temperatures may exacerbate the stress. At small feature sizes, such as less than about 7 nanometers, features are weak and the high thermal stress may lead to a high likelihood of peeling and/or collapse. Further, to the extent that temperatures of the SPM cleaning processes are reduced, the solubility of the polymer and hence the cleaning efficiency reduces. Another challenge with the SPM cleaning processes is solubility and/or wettability. Certain polymers, such as ion-implanted photoresist and fluorocarbon polymer, have poor solubility and/or wettability in the mixture, such that cleaning efficiency may be low. Yet another challenge with the SPM cleaning processes is slow oxidation of the polymer, since Caro's acid is the dominant oxidant in the mixture.

The present application is directed towards a method for removing polymer using reactive radicals, as well as a process tool for performing the method. In some embodiments, an aqueous solution is applied to a semiconductor workpiece with polymer arranged thereon. The aqueous solution comprises an energy receiver configured to generate reactive radicals in response to energy. Energy is applied to the aqueous solution to generate the reactive radicals in the aqueous solution and to remove the polymer. Where the reactive radicals are hydroxyl radicals, the polymer may advantageously be removed at low temperatures, such as less than about 100 degrees Celsius. As such, thermal stress on the semiconductor workpiece is minimal, and the likelihood of feature collapse or peeling is minimal. Further, high concentrations of the hydroxyl radicals, such as greater than 1 part per million (ppm), advantageously increase solubility and/or wettability to the aqueous solution and/or other aqueous solutions, thereby promoting high cleaning efficiency.

Figure 1B:
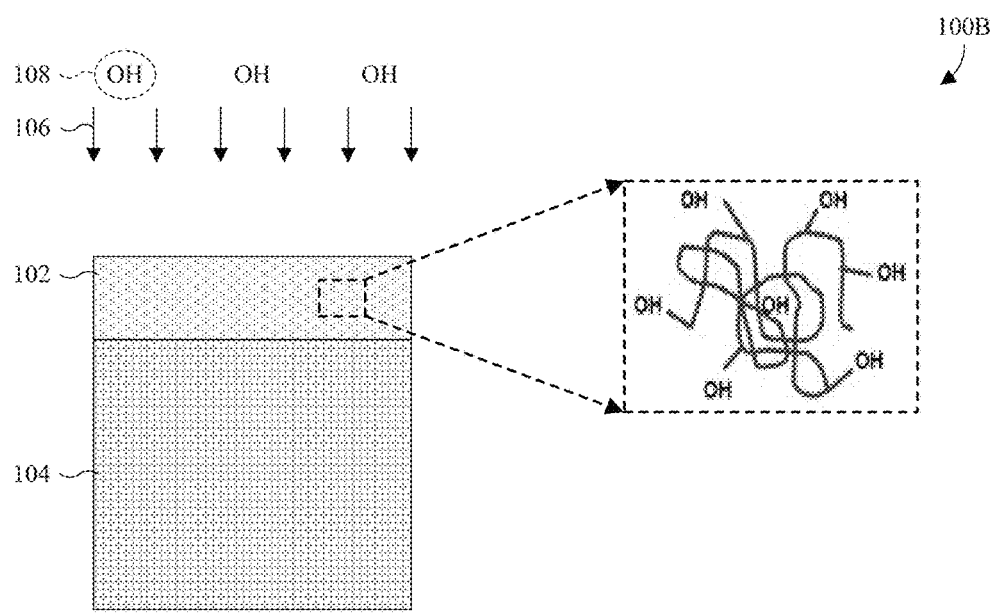
Figure 1C:
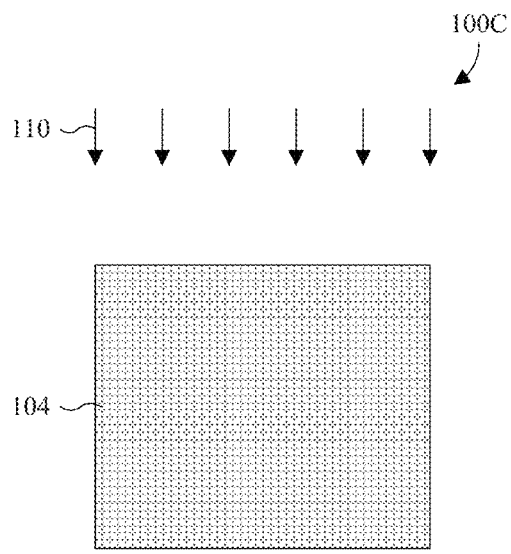

With reference to FIGS. 1A-1C, a series of cross-sectional views 100A-100C illustrate some embodiments of a method for removing polymer using reactive radicals.

As illustrated by the cross-sectional view 100A of FIG. 1A, one or more semiconductor manufacturing processes are performed to form polymer 102 over a semiconductor workpiece 104. The polymer 102 may be, for example, ion-implanted photoresist, photoresist without ion implants, fluorocarbon polymer, and dry-etch-gas polymer. The semiconductor workpiece 104 comprises a semiconductor substrate and, in some embodiments, one or more additional layers and/or structures stacked thereover. The semiconductor substrate may be, for example, a bulk silicon substrate (e.g., of monocrystalline silicon), a germanium substrate, or a group III-V substrate.

In embodiments where the polymer 102 is photoresist with or without ion implants, the semiconductor manufacturing process(es) may, for example, comprise spin coating or otherwise depositing the polymer 102 and/or ion implantation into the polymer 102. In embodiments where the polymer 102 is fluorocarbon polymer, the semiconductor manufacturing process(es) may, for example, comprise a dry etch using process gases with carbon and fluoride, such as carbon tetrafluoride. In embodiments where the polymer 102 is dry-etch-gas polymer, the semiconductor manufacturing process(es) may, for example, comprise dry etching.

As illustrated by the cross-sectional view 100B of FIG. 1B, a fluid 106 comprising reactive radicals 108 is generated and applied to the polymer 102. In some embodiments, the fluid 106 has a concentration of reactive radicals greater than about 1 ppm, and/or the fluid 106 is an aqueous solution or steam. Further, in some embodiments where the fluid 106 is an aqueous solution, the fluid 106 has a temperature less than about 100 degrees Celsius, such as between 30-90 degrees Celsius. For example, the fluid 106 may be an aqueous solution with a temperature less than about 100 degrees Celsius, and/or a concentration of reactive radicals greater than about 1 ppm, at the surface of the polymer 102. In alternative embodiments, stable radicals, such as TEMPO, may be employed in place of the reactive radicals 108.

The reactive radicals 108 are highly reactive, oxidative, hydrophilic, or a combination the foregoing. For example, the reactive radicals 108 may be hydroxyl (OH) radicals. As another example, the reactive radicals 108 may be radicals that have a lifetime less than about 1 second and that have an oxidation potential greater than about 1.8 volts. The reactive radicals 108 react with and attach to the polymer 102 to modify the polymer 102 and to at least partially remove the polymer 102 from the semiconductor workpiece 104. For example, the reactive radicals 108 may increase solubility of the polymer 102, increase wettability of the polymer 102, reduce internal stress or hardness of the polymer 102, oxidize the polymer 102, or a combination of the foregoing. The increase in solubility and/or wettability advantageously facilitates high cleaning efficiency, and/or the reduction in internal stress or hardness advantageously reduces the likelihood of feature collapse and/or peeling. Further, the increased solubility and/or oxidation advantageously facilitate removal of the polymer 102.

In some embodiments, the fluid 106 is generated by applying energy to an aqueous solution with an energy receiver dissolved therein. The energy may be, for example, restricted so the aqueous solution remains in liquid form, or may alternatively be, for example, sufficient to gasify the aqueous solution. Further, the energy may, for example, be applied by sound waves, infrared radiation, heat, or ultraviolet (UV) radiation. The energy receiver is configured to generate the reactive radicals 108 in response to the energy, and is a chemical compound or molecule. For example, where the reactive radicals 108 are hydroxyl radicals, the energy receiver may be, for example, ozonated deionized water (e.g., $DIO_3$) or hydrogen peroxide (e.g., $H_2O_2$). Further, the energy receiver may, for example, be dissolved in water (e.g., $H_2O$), and/or may, for example, have a concentration ranging from 1 ppm to 30 wt %.

As illustrated by the cross-sectional view 100C of FIG. 1C, in some embodiments, an additional polymer cleaning process is performed on the semiconductor workpiece 104 to further remove the polymer 102 from the semiconductor workpiece 104. For example, a wet cleaning solution or mixture 110 may be applied to the semiconductor workpiece 104. The wet cleaning solution of mixture 110 may be, for example, an SPM for front-end-of-line (FEOL) cleaning and/or an organic solvent for back-end-of-line (BEOL) cleaning. As noted above, the reactive radicals 108 may be sufficient to remove the polymer 102. However, to the extent that the reactive radicals 108 are insufficient and the additional polymer cleaning process is performed, the modification to the polymer 102 by the reactive radicals 108 aids the additional polymer cleaning process in removing the polymer 102. For example, cleaning efficiency may be increased due to the increased wettability and/or the solubility of the polymer 102. As another example, the likelihood of feature collapse and/or peeling may be reduced due to the reduced stress or hardness of the polymer 102.

Figure 2:
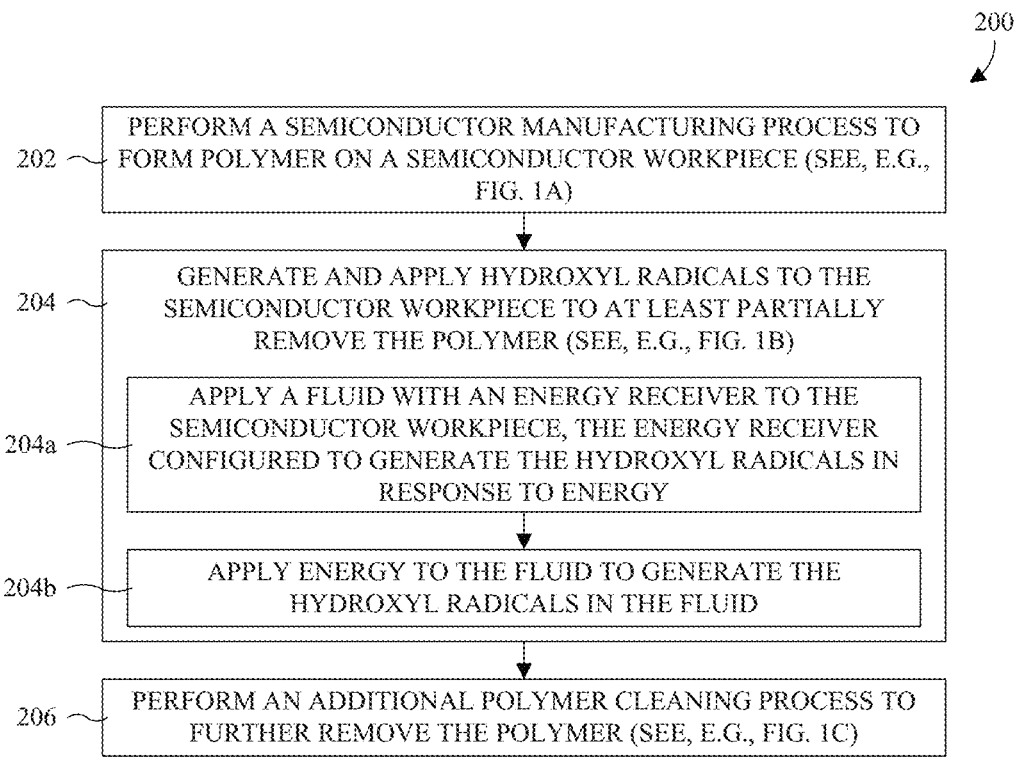
FIG. 2 illustrates a flowchart of some embodiments of the method of FIGS. 1A-1C.

With reference to FIG. 2, a flowchart 200 of some embodiments of the method of FIGS. 1A-1C is provided.

At 202, a semiconductor manufacturing process is performed to form polymer on a semiconductor workpiece. See, for example, FIG. 1A.

At 204, hydroxyl radicals are generated and applied to the semiconductor workpiece to at least partially remove the polymer. See, for example, FIG. 1B. In some embodiments, the process for generating the hydroxyl radicals comprises applying at 204a a fluid with an energy receiver to the semiconductor workpiece, where the energy receiver is configured to generate the hydroxyl radicals in response to energy. Further, in some embodiments, the process comprises applying at 204b energy to the fluid to generate the hydroxyl radicals in the fluid.

At 206, in some embodiments, an additional polymer cleaning process is performed to further remove the polymer. See, for example, FIG. 1C.

While the method described by the flowchart 200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 3:
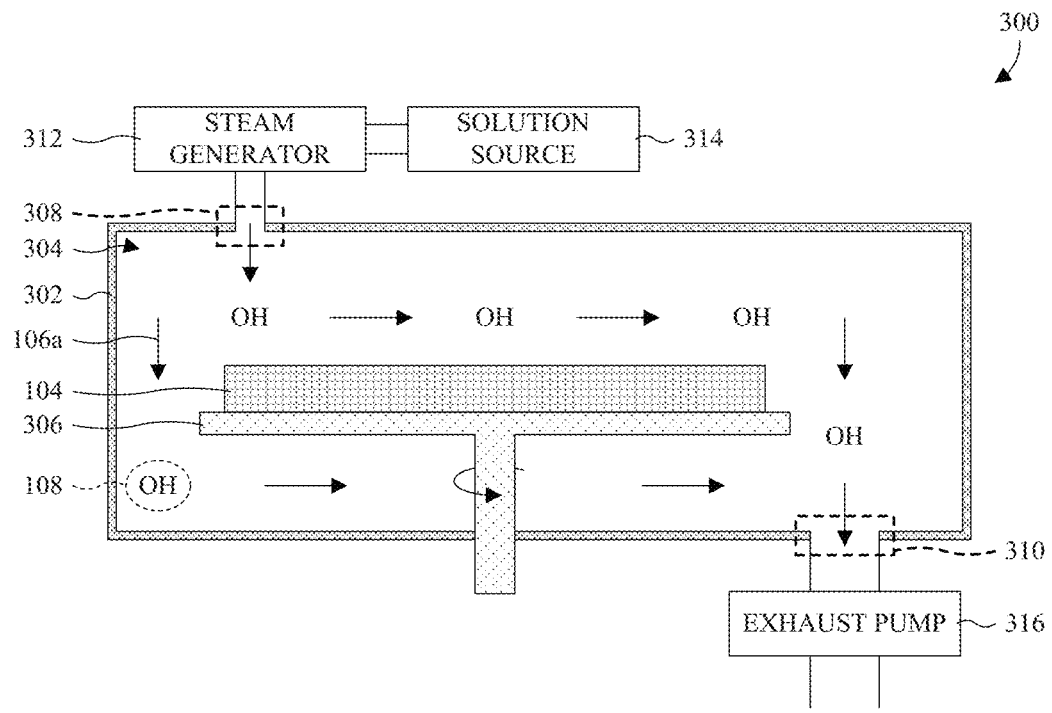
FIG. 3 illustrates a cross-sectional view of some embodiments of a process tool for generating steam with reactive radicals.

With reference to FIG. 3, a cross-sectional view 300 of some embodiments of a process tool for generating steam 106a with reactive radicals 108 is provided. The process tool may, for example, be employed during a polymer cleaning process and/or to generate the fluid 106 of FIGS. 1A-1C and 2. As illustrated, a housing 302 defines a process chamber 304 within which a workpiece support 306 is arranged. In some embodiments, the process chamber 304 has a controlled atmosphere differing from an ambient environment of the process tool. For example, the controlled atmosphere may have a different pressure and/or temperature than the ambient environment. The workpiece support 306 is configured to support a semiconductor workpiece 104 and, in some embodiments, to rotate the semiconductor workpiece 104 and/or to heat the semiconductor workpiece 104.

The housing 302 comprises an inlet 308 and an outlet 310 that are laterally spaced and respectively arranged on the top and the bottom of the housing 302. The inlet 308 is connected to a steam generator 312 and is configured to receive steam 106a with reactive radicals 108 from the steam generator 312. The steam 106a may, for example, have a temperature less than about 100 degrees Celsius. Further, the reactive radicals 108 may, for example, have a concentration greater than about 1 ppm in the steam 106a, and/or may be, for example, hydroxyl radicals. In some embodiments, the steam generator 312 is configured to generate the steam 106a by gasifying or otherwise heating an aqueous solution with an energy receiver arranged therein. The energy receiver is configured to generate the reactive radicals 108 in response to energy and may be, for example, received from a solution source 314. Where the reactive radicals 108 are hydroxyl radicals, the aqueous solution may be, for example, a hydrogen peroxide solution. The hydrogen peroxide solution may, for example, have a concentration of hydrogen peroxide between 1 ppm and 30 wt %. The outlet 310 is connected to an exhaust pump 316 configured to receive the steam 106a from the process chamber 304 after it flows over the semiconductor workpiece 104.

Advantageously, as the steam 106a and the reactive radicals 108 flow over the semiconductor workpiece 104, the reactive radicals 108 react with and attach to polymer (not shown) on the semiconductor workpiece 104 to modify the polymer and to at least partially remove the polymer from the semiconductor workpiece 104. For example, the reactive radicals 108 may increase solubility, increase wettability, reduce internal stress, or a combination of the foregoing. Modification of the polymer 102 advantageously facilitates high cleaning efficiency and/or reduces the likelihood of feature collapse and/or peeling.

Figure 4A:
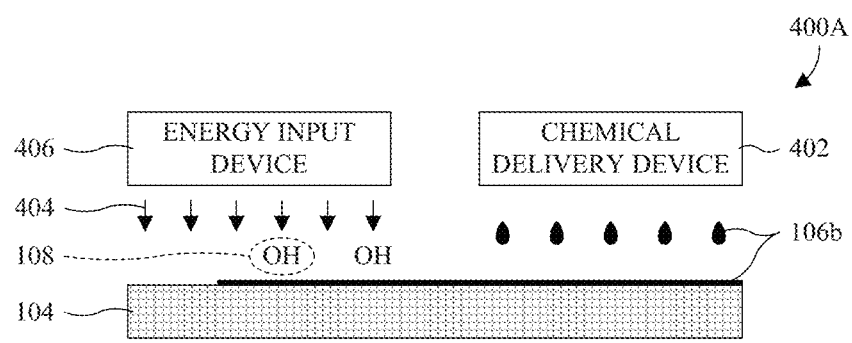
FIGS. 4A and 4B illustrate cross-sectional views of some embodiments of a process tool for generating an aqueous solution with reactive radicals.
Figure 4B:
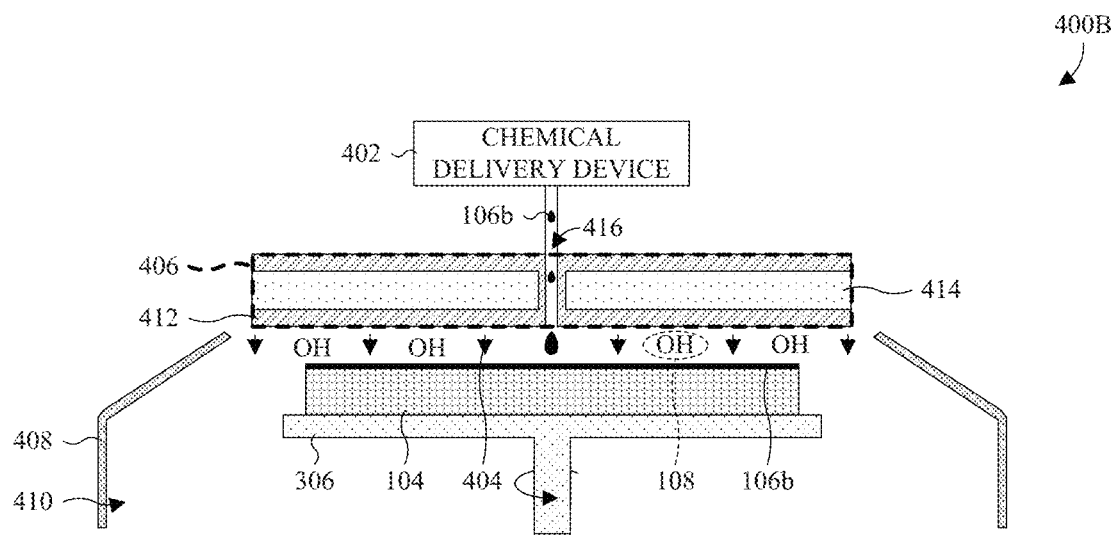

With reference to FIGS. 4A and 4B, cross-sectional views 400A, 400B of some embodiments of a process tool for generating an aqueous solution 106b with reactive radicals 108 is provided. The process tool may, for example, be employed during a polymer cleaning process and/or to generate the fluid 106 of FIGS. 1A-1C and 2.

As illustrated by the cross-sectional view 400A of FIG. 4A, a chemical delivery device 402 is configured to deliver or otherwise apply an aqueous solution 106b to a semiconductor workpiece 104 and, in some embodiments, to generate or otherwise mix the aqueous solution. The aqueous solution 106b comprises an energy receiver (e.g., a chemical compound) configured to generate reactive radicals 108 in response to energy 404, and the energy receiver may be or otherwise comprise, for example, ozonated deionized water or hydrogen peroxide to generate the reactive radicals 108 as hydroxyl radicals. In some embodiments, the chemical delivery device 402 is configured to apply the aqueous solution 106b at a temperature less than about 100 degrees Celsius, such as between about 30-90 degrees Celsius, and/or is configured to apply the aqueous solution 106b with a concentration of energy receiver that is between about 1 ppm and 30 wt %. Further, in some embodiments, the chemical delivery device 402 is configured to apply additional aqueous solutions to the semiconductor workpiece 104, such as those used by an RCA cleaning process.

An energy input device 406 is configured to apply the energy 404 to the aqueous solution 106b, thereby generating the reactive radicals 108 in the aqueous solution 106b. In some embodiments, the energy input device 406 applies the energy 404 with sufficient intensity and/or duration to generate the reactive radicals 108 with a concentration exceeding about 1 ppm in the aqueous solution 106b. Further, in some embodiments, the energy input device 406 focuses the energy 404 towards the semiconductor workpiece 104, so as to generate the reactive radicals 108 at the semiconductor workpiece 104. The energy input device 406 may be, for example, an ultraviolet lamp configured to apply the energy 404 by way of UV radiation. Alternatively, the energy input device 406 may be, for example, a sonic transducer configured to apply the energy 404 by way of sound waves. Alternatively, the energy input device 406 may be, for example, a heater configured to apply the energy 404 by infrared radiation. In some embodiments, the heater is a resistive heater, and/or is configured to apply the infrared radiation to the aqueous solution 106b without accompanying UV radiation or sound waves.

Advantageously, as the aqueous solution 106b and the reactive radicals 108 react with and attach to polymer (not shown) on the semiconductor workpiece 104 to modify the polymer and to at least partially remove the polymer from the semiconductor workpiece 104. For example, the reactive radicals 108 may increase solubility, increase wettability, reduce internal stress, or a combination of the foregoing. Modification of the polymer 102 advantageously facilitates high cleaning efficiency and/or reduces the likelihood of feature collapse and/or peeling.

As illustrated by the cross-sectional view 400B of FIG. 4B, a housing 408 (partially shown) defines a cavity 410 within which a workpiece support 306 is arranged. The workpiece support 306 is configured to support a semiconductor workpiece 104 and, in some embodiments, to rotate the semiconductor workpiece 104.

The energy input device 406 is arranged over the workpiece support 306, proximate an opening in the housing 408. Further, in some embodiments, the energy input device 406 fully covers the workpiece support 306. The energy input device 406 comprises a body 412 supporting a UV lamp 414 therein, and further comprises a conduit 416 extending through the body 412. The conduit 416 connects to the chemical delivery device 402 and provides the chemical delivery device 402 with a path for introducing the aqueous solution 106b to the semiconductor workpiece 104. In some embodiments, the conduit 416 is arranged at an axis of rotation for the workpiece support 306, such that centrifugal force moves the aqueous solution 106b to a periphery of the semiconductor workpiece 104.

With reference to FIGS. 5-22, a series of cross-sectional and perspective views 500-2200 illustrate some embodiments of a method for manufacturing a finFET using reactive radicals for polymer cleaning. The polymer cleaning may, for example, be performed as described by the method of FIGS. 1A-1C and 2, and/or the reactive radicals may, for example, be generated using the process tools of FIGS. 3, 4A, and 4B.

Figure 5:
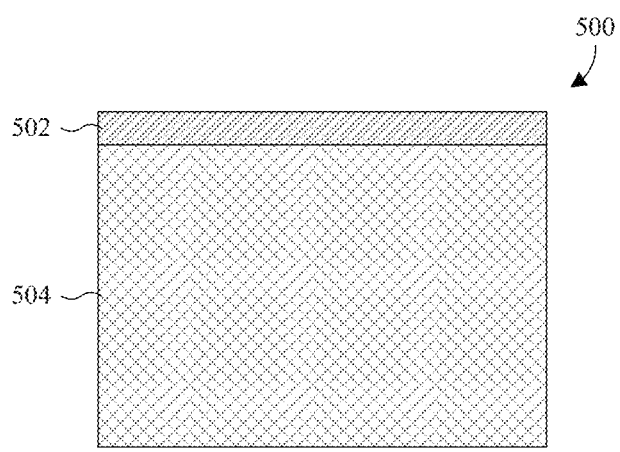
FIGS. 5-22 illustrate a series of cross-sectional and perspective views of some embodiments of a method for manufacturing a fin field-effect transistor (finFET) using reactive radicals for polymer cleaning.

As illustrated by the cross-sectional view 500 of FIG. 5, a hard mask layer 502 is formed over a semiconductor substrate 504. The hard mask layer 502 may, for example, be formed of silicon dioxide or silicon nitride, and/or the semiconductor substrate 504 may be, for example, a silicon substrate (e.g., a bulk monocrystalline silicon substrate), a germanium substrate, or a group III-V substrate. In some embodiments, the process for forming the hard mask layer 502 comprises depositing or otherwise growing the hard mask layer 502 over the semiconductor substrate 504. For example, the hard mask layer 502 may be grown by thermal oxidation, or deposited by chemical or physical vapor deposition.

Figure 6:
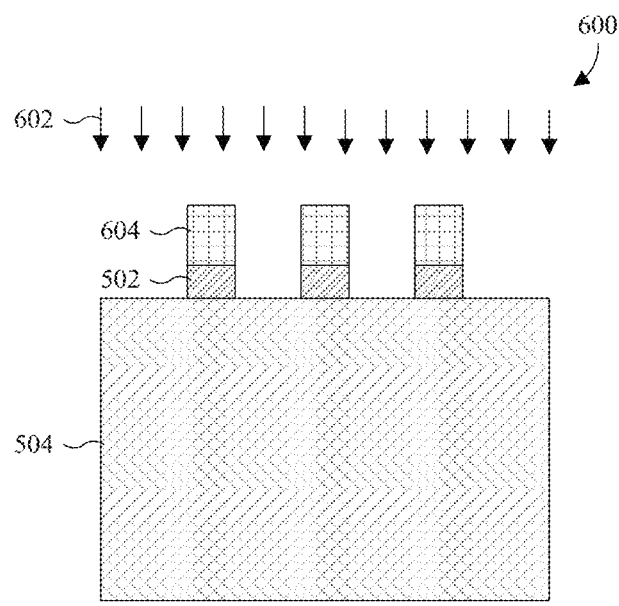

As illustrated by the cross-sectional view 600 of FIG. 6, a first etch is performed into the hard mask layer 502 to pattern the hard mask layer 502 with a fin pattern for the finFET. The fin pattern may, for example, comprise one or more elongated features extending laterally in parallel. In some embodiments, the process for patterning the hard mask layer 502 comprises applying etchants 602 to the hard mask layer 502, while a first photoresist layer 604 lithographically patterned with the fin pattern is in place. Further, in some embodiments, the process comprises removing or otherwise stripping the first photoresist layer 604. The first photoresist layer 604 may, for example, be removed or otherwise stripped using the method of FIGS. 1A-C and 2 and/or using one of the process tools of FIGS. 3, 4A, and 4B.

Figure 7:
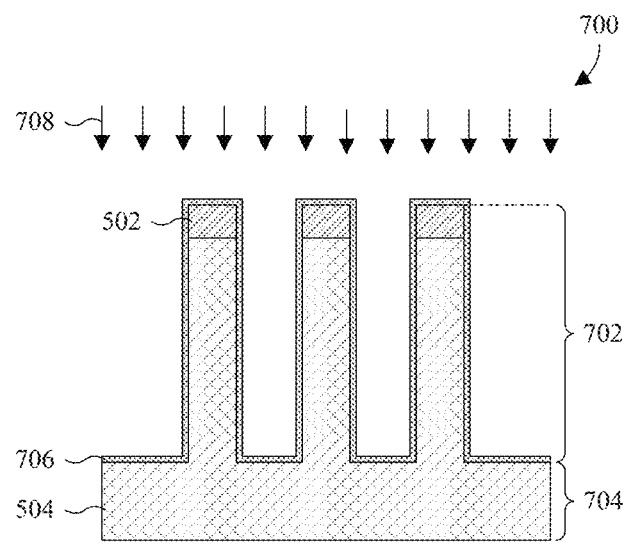

As illustrated by the cross-sectional view 700 of FIG. 7, a second etch is performed into the semiconductor substrate 504 with the hard mask layer 502 in place. The second etch results in one or more fins 702 protruding upward from a base 704 of the semiconductor substrate 504. Further, the second etch results in a first polymer by-product layer 706 lining the semiconductor substrate 504. The first polymer by-product layer 706 may be, for example, fluorocarbon polymer or residue from dry etching gases. Further, while the first polymer by-product layer 706 is shown conformally lining the fin(s) 702 for ease of illustration, the first polymer by-product layer 706 may, for example, have length-wise discontinuities and/or non-uniformities in thickness. In some embodiments, the process for performing the second etch comprises applying an etchant 708 to the semiconductor substrate 504. The etchant 708 may, for example, be applied according to a dry or plasma etch process and/or using, for example, a process gas comprising carbon and fluoride, such as carbon tetrafluoride (e.g., $CF_4$).

Figure 8:
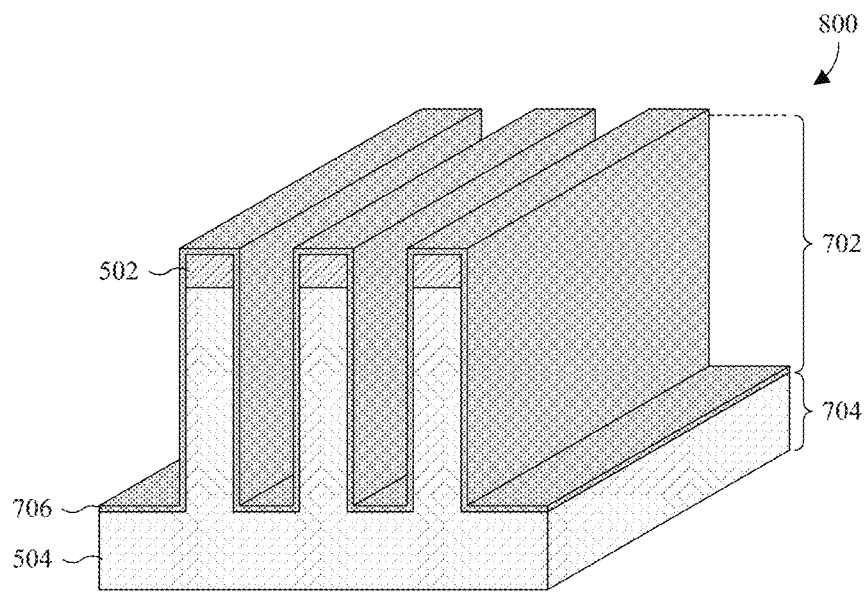

As illustrated by the perspective view 800 of FIG. 8, the fin(s) 702 resulting from the second etch extend laterally in parallel.

Figure 9:
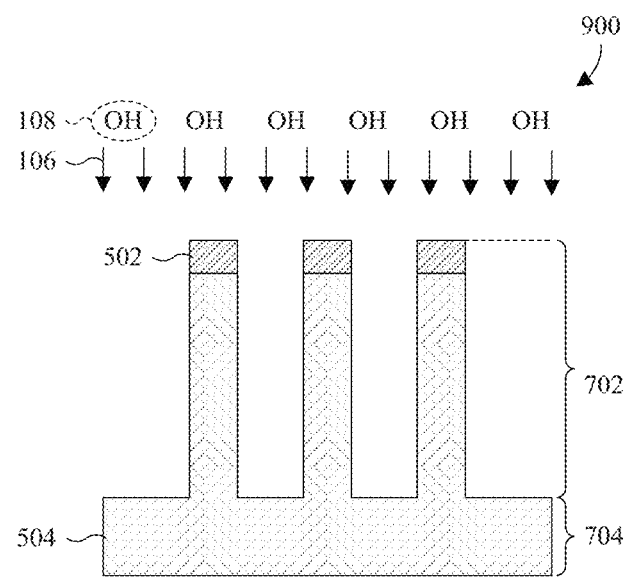

As illustrated by the cross-sectional view 900 of FIG. 9, the first polymer by-product layer 706 (see, e.g., FIGS. 7 and 8) is removed. In some embodiments, the removal process comprises, or is otherwise performed according to, the method of FIGS. 1A-C and 2. For example, the removal process may comprise applying a fluid 106 with reactive radicals 108, such as hydroxyl radicals, to the first polymer by-product layer 706. Further, in some embodiments, the removal process is performed using one of the process tools of FIGS. 3, 4A, and 4B.

Figure 10:
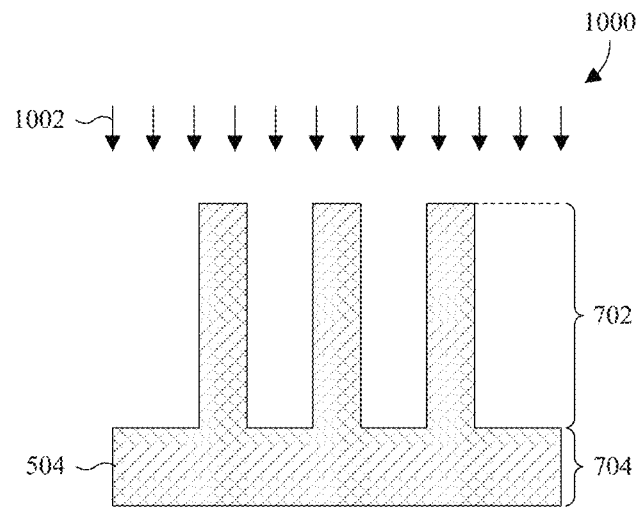

As illustrated by the cross-sectional view 1000 of FIG. 10, in some embodiments, a third etch is performed into the hard mask layer 502 (see, e.g., FIG. 9) to remove the hard mask layer 502. In some embodiments, the process for performing the third etch comprises applying an etchant 1002 that is selective of the hard mask layer 502 to the hard mask layer 502. Further, in some embodiments, the process comprises removing etch residue using the method of FIGS. 1A-C and 2, and/or using one of the process tools of FIGS. 3, 4A, and 4B.

Figure 11:
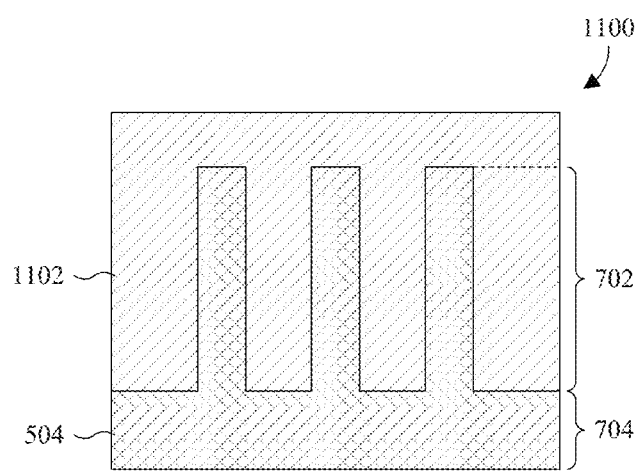

As illustrated by the cross-sectional view 1100 of FIG. 11, a first dielectric layer 1102 is formed over the semiconductor substrate 504 and with an upper or top surface that is planar. The first dielectric layer 1102 may, for example, be formed as silicon dioxide, a low κ dielectric (i.e., a dielectric with a dielectric constant κ less than about 3.9), or phosphosilicate glass (PSG). In some embodiments, the process for forming the first dielectric layer 1102 comprises depositing or otherwise growing the first dielectric layer 1102 over the semiconductor substrate 504. For example, the first dielectric layer 1102 may be grown by thermal oxidation or deposited by vapor deposition. Further, in some embodiments, the process comprises performing a planarization into the upper or top surface of the first dielectric layer 1102. The planarization may, for example, be performed by a chemical mechanical polish (CMP).

Figure 12:
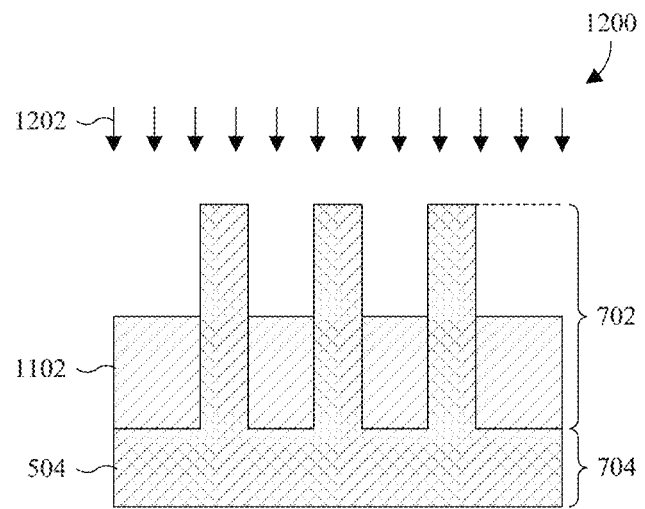

As illustrated by the cross-sectional view 1200 of FIG. 12, a fourth etch is performed into the first dielectric layer 1102 to recess the upper or top surface of the first dielectric layer 1102 to below an upper or top surface of the fin(s) 702. In some embodiments, the process for performing the fourth etch comprises applying an etchant 1202 selective of the first dielectric layer 1102 to the first dielectric layer 1102 until the first dielectric layer 1102 is sufficiently etched back. Further, in some embodiments, the process comprises removing etch residue using the method of FIGS. 1A-C and 2, and/or using one of the process tools of FIGS. 3, 4A, and 4B.

Figure 13:
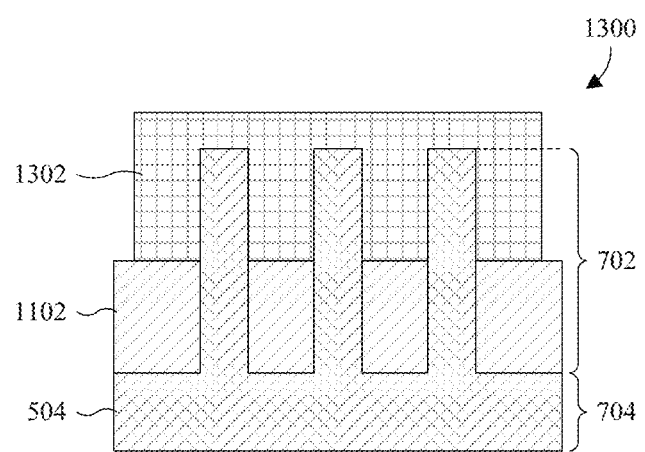

As illustrated by the cross-sectional view 1300 of FIG. 13, a second photoresist layer 1302 is formed masking a gate region of the finFET. In some embodiments, the process for forming the second photoresist layer 1302 comprises depositing the second photoresist layer 1302 and subsequently patterning the second photoresist layer 1302 using lithography. The second photoresist layer 1302 may, for example, be deposited by spin coating.

Figure 14:
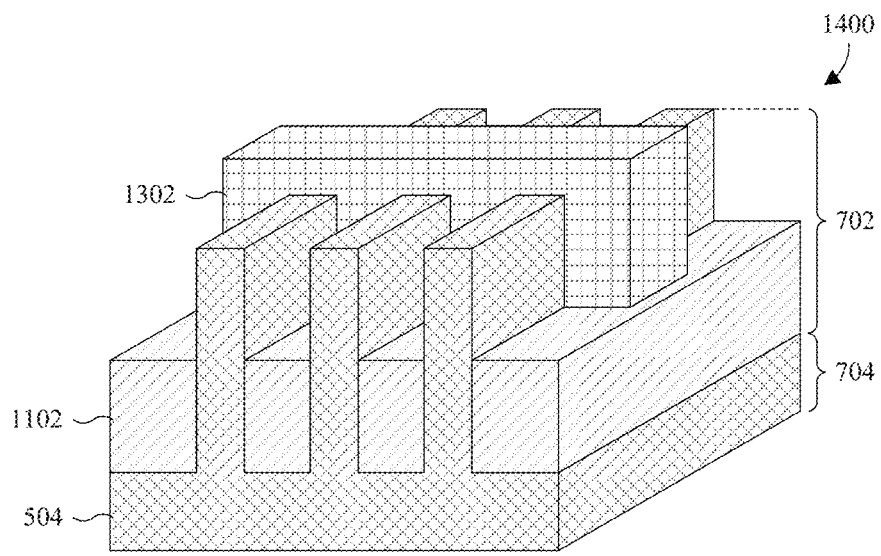

As illustrated by the perspective view 1400 of FIG. 14, the second photoresist layer 1302 straddles the fin(s) 702 and extends laterally in a direction orthogonal to a length of the fin(s) 702. Further, the second photoresist layer 1302 is laterally spaced from ends of the fin(s) 702, along the length of the fin(s) 702.

Figure 15:
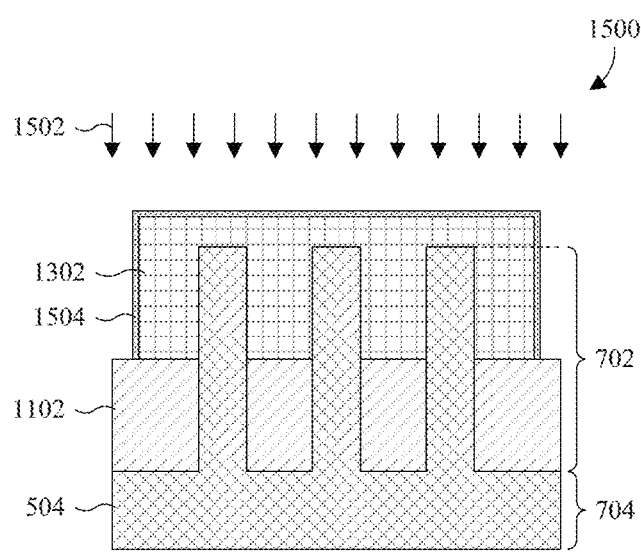

As illustrated by the cross-sectional view 1500 of FIG. 15, ions 1502 are implanted into regions of the fin(s) 702 that are unmasked by the second photoresist layer 1302 to form source/drain regions 1602 (see, e.g., FIG. 16) in the fin(s) 702. Further, the ion implantation forms a second polymer by-product layer 1504 (e.g., a crust) along an outer surface of the second photoresist layer 1302.

Figure 16:
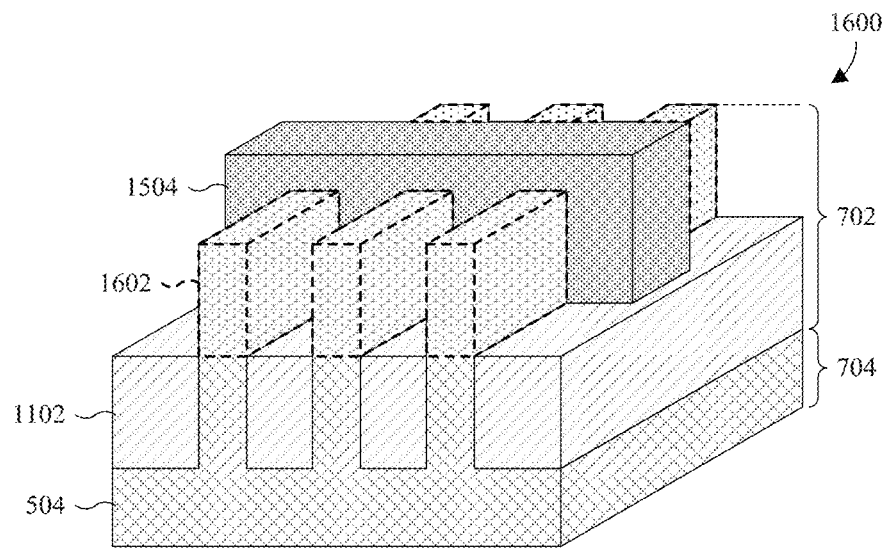

As illustrated by the perspective view 1600 of FIG. 16, the source/drain regions 1602 are formed laterally spaced along the length of the fin(s) 702, on opposite sides of the second polymer by-product layer 1504.

Figure 17:
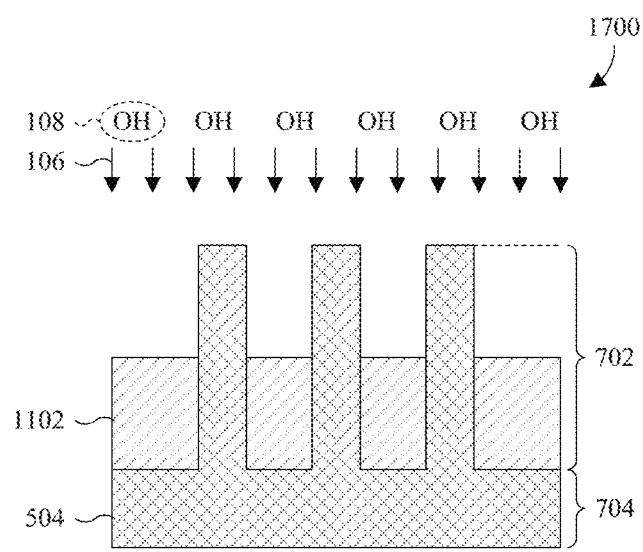

As illustrated by the cross-sectional view 1700 of FIG. 17, the second photoresist layer 1302 (see, e.g., FIG. 15) and the second polymer by-product layer 1504 (see, e.g., FIG. 16) are removed. In some embodiments, the removal process comprises, or is otherwise performed according to, the method of FIGS. 1A-C and 2. For example, the removal process may comprise applying a fluid 106 with reactive radicals 108 to the second photoresist layer 1302 and the second polymer by-product layer 1504. Further, in some embodiments, the removal process is performed using one of the process tools of FIGS. 3, 4A, and 4B.

Figure 18:
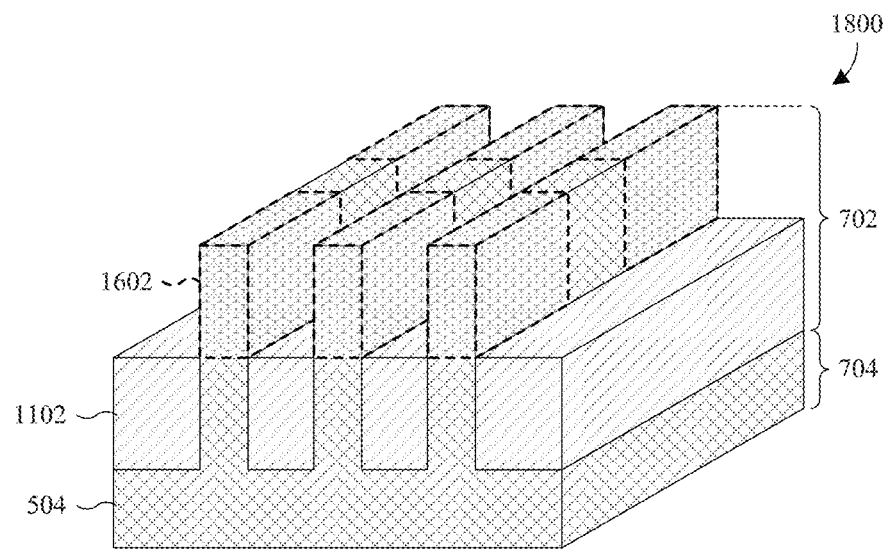

As illustrated by the perspective view 1800 of FIG. 18, the source/drain regions 1602 are arranged on ends of the fin(s) 702 and laterally spaced by the gate region previously masked by the second photoresist layer 1302 (see, e.g., FIG. 15).

Figure 19:
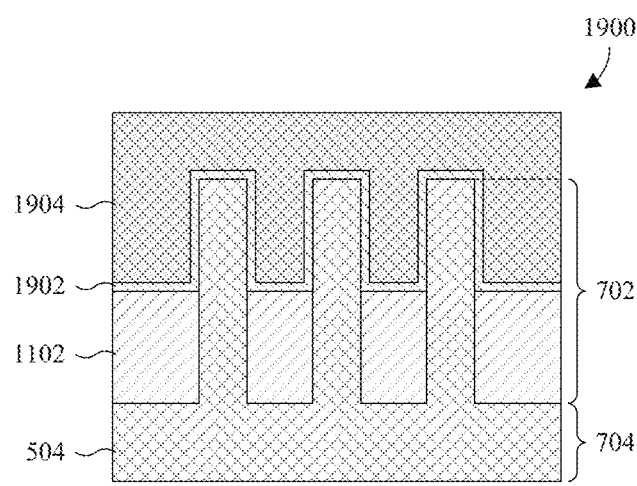

As illustrated by the cross-sectional view 1900 of FIG. 19, a second dielectric layer 1902 and a conductive layer 1904 are formed covering the fin(s) 702. Further, the conductive layer 1904 is formed over the second dielectric layer 1902 and with an upper or top surface that is planar. The second dielectric layer 1902 may, for example, be formed of silicon dioxide, and/or the conductive layer 1904 may, for example, be formed of doped polysilicon or metal. In some embodiments, the process for forming the second dielectric layer 1902 and the conductive layer 1904 comprises sequentially depositing and/or growing the second dielectric layer 1902 and the conductive layer 1904. The second dielectric layer 1902 and/or the conductive layer 1904 may, for example, be deposited or otherwise grown conformally and/or using thermal oxidation or vapor deposition. Further, in some embodiments, the process comprises performing a planarization into the upper or top surface of the conductive layer 1904.

Figure 20:
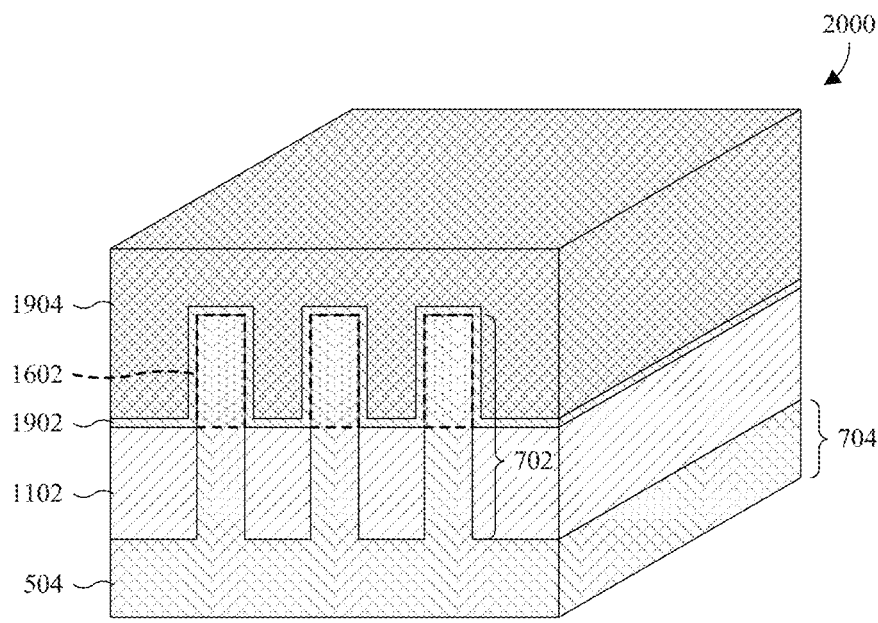

As illustrated by the perspective view 2000 of FIG. 20, the second dielectric layer 1902 and the conductive layer 1904 cover the source/drain regions 1602 and the gate region previously masked by the second photoresist layer 1302 (see, e.g., FIG. 15).

Figure 21:
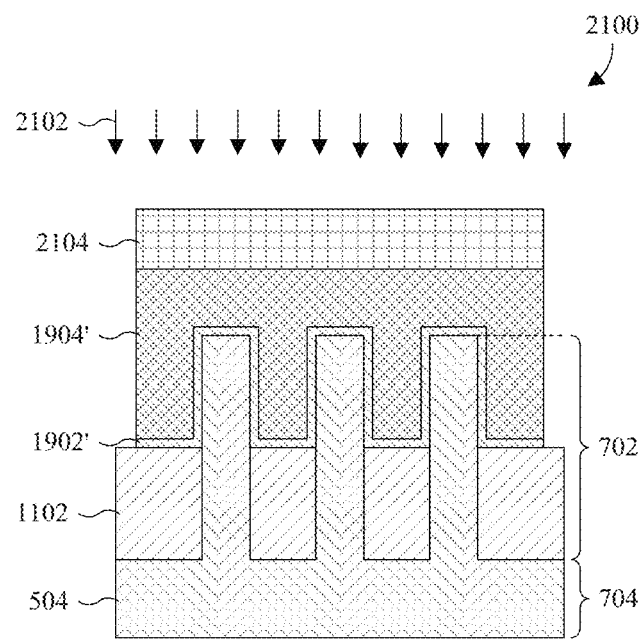

As illustrated by the cross-sectional view 2100 of FIG. 21, a fifth etch is performed into the second dielectric layer 1902 (see, e.g., FIG. 20) and the conductive layer 1904 (see, e.g., FIG. 20) to form a gate electrode 1904' straddling the fin(s) 702 and electrically insulated from the fin(s) 702 by a gate dielectric layer 1902'. In some embodiments, the process for forming the gate electrode 1904' and the gate dielectric layer 1902' comprises applying etchants 2102 to the conductive layer 1904 and the second dielectric layer 1902, while a third photoresist layer 2104 lithographically patterned with a gate pattern is in place. Further, in some embodiments, the process comprises removing or otherwise stripping the third photoresist layer 2104 using the method of FIGS. 1A-C and 2, and/or using one of the process tools of FIGS. 3, 4A, and 4B.

Figure 22:
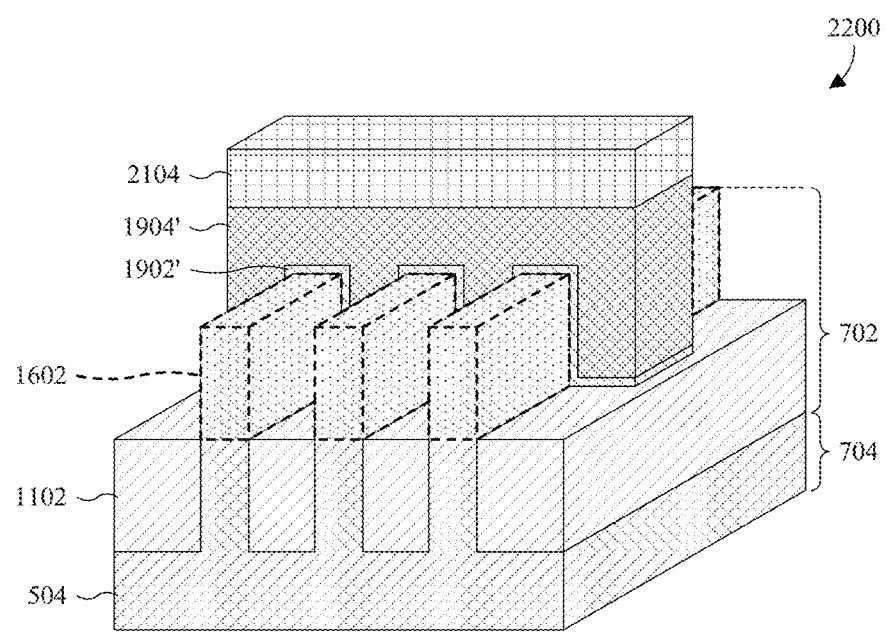

As illustrated by the perspective view 2200 of FIG. 22, the gate dielectric layer 1902' and the gate electrode 1904' are formed laterally between the source/drain regions 1602, thereby defining a channel region along the length of the fin(s) 702.

Figure 23:
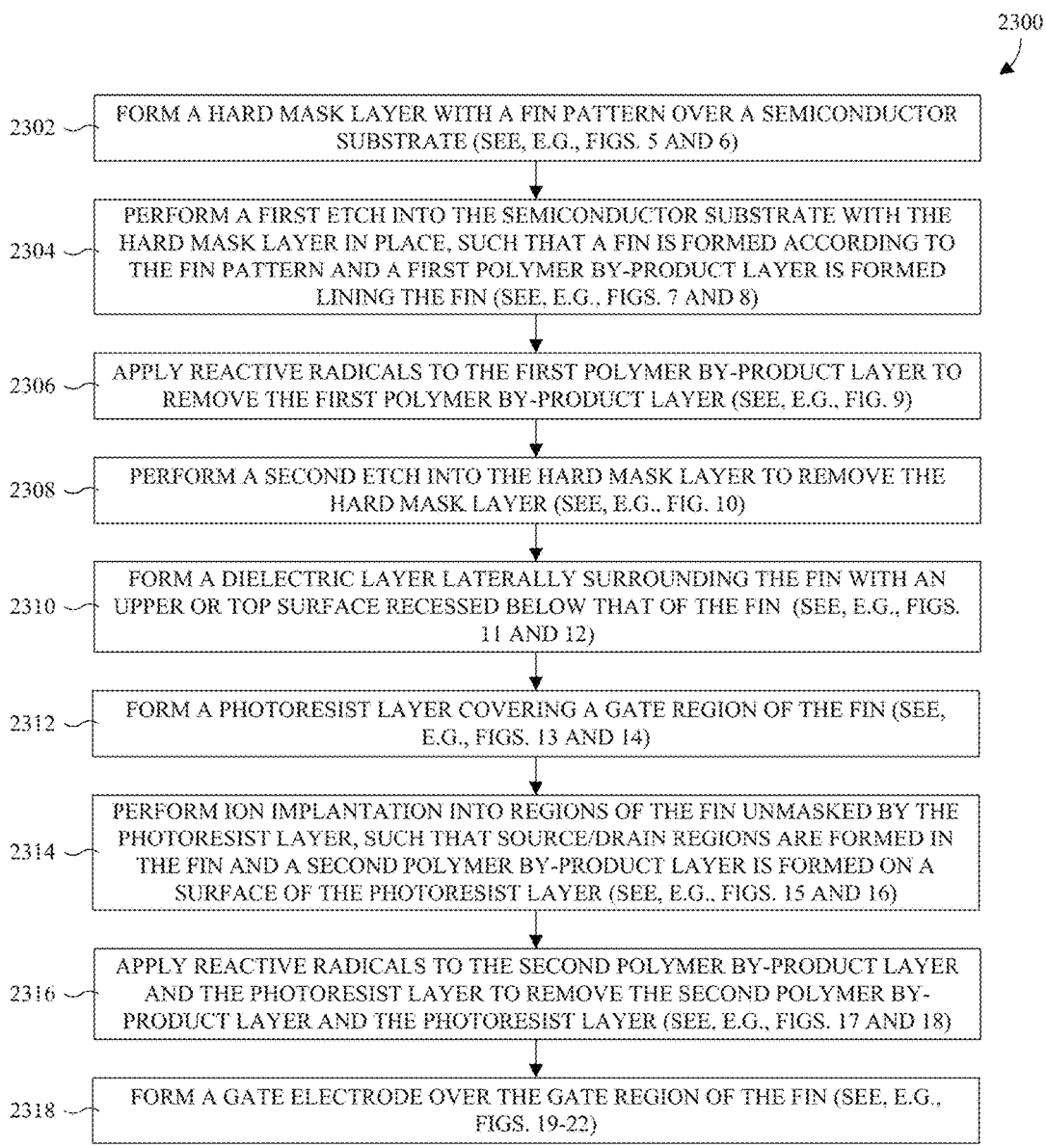
FIG. 23 illustrates a flowchart of some embodiments of the method of FIGS. 5-22.

With reference to FIG. 23, a flowchart 2300 of some embodiments of the method of FIGS. 5-22 is provided.

At 2302, a hard mask layer with a fin pattern is formed over a semiconductor substrate. See, for example, FIGS. 5 and 6.

At 2304, a first etch is performed into the semiconductor substrate with the hard mask layer in place, such that a fin is formed according to the fin pattern and a first polymer by-product layer is formed lining the fin. See, for example, FIGS. 7 and 8.

At 2306, reactive radicals, such as hydroxyl radicals, are applied to the first polymer by-product layer to remove the first polymer by-product layer. See, for example, FIG. 9.

At 2308, a second etch is performed into the hard mask layer to remove the hard mask layer. See, for example, FIG. 10.

At 2310, a first dielectric layer is formed laterally surrounding the fin with an upper or top surface recessed below that of the fin. See, for example, FIGS. 11 and 12.

At 2312, a photoresist layer is formed covering a gate region of the fin. See, for example, FIGS. 13 and 14.

At 2314, ion implantation is performed into regions of the fin unmasked by the photoresist layer, such that source/drain regions are formed in the fin and a second polymer by-product layer is formed on a surface of the photoresist layer. See, for example, FIGS. 15 and 16.

At 2316, reactive radicals, such as hydroxyl radicals, are applied to the second polymer by-product layer and the photoresist layer to remove the second polymer by-product layer and the photoresist layer. See, for example, FIGS. 17 and 18.

At 2318, a gate electrode is formed over the gate region of the fin. See, for example, FIGS. 19-22.

While the method described by the flowchart 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a first method for removing polymer. An aqueous solution is applied to a semiconductor workpiece with polymer arranged thereon. The aqueous solution comprises an energy receiver configured to generate hydroxyl radicals in response to energy. Energy is applied to the aqueous solution to generate the hydroxyl radicals in the aqueous solution and to remove the polymer.

In other embodiments, the present disclosure provides a process tool for removing polymer. A chemical delivery device is configured to apply an aqueous solution with an energy receiver to a semiconductor workpiece. The energy receiver is configured to generate hydroxyl radicals in response to energy. An energy input device is configured to apply energy to the energy receiver, while the chemical delivery device applies the aqueous solution to the semiconductor workpiece, to generate the hydroxyl radicals.

In yet other embodiments, the present disclosure provides a second method for removing polymer. A semiconductor manufacturing process is performed to form polymer on a semiconductor workpiece. A fluid with hydroxyl radicals is generated from ozonated deionized water or hydrogen peroxide. The fluid is applied to the semiconductor workpiece to remove the polymer from the semiconductor workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing polymer, the method comprising:
performing a first etch selectively into a semiconductor workpiece to form a fin protruding upward from a base of the semiconductor workpiece, wherein the first etch results in a polymer by-product layer lining the fin;
applying an aqueous solution to the semiconductor workpiece with the polymer by-product layer arranged thereon, wherein the aqueous solution comprises an energy receiver configured to generate reactive radicals in response to energy;

applying energy to the aqueous solution to generate the reactive radicals in the aqueous solution and to remove the polymer by-product layer;

forming a photoresist layer masking a gate region of the fin;

implanting ions into regions of the fin unmasked by the photoresist layer to define a pair of source/drain regions in the fin, wherein implanting the ions results in an additional polymer by-product layer on the photoresist layer;

applying a fluid with reactive radicals to the additional polymer by-product layer to remove the additional polymer by-product layer; and after removing the additional polymer by-product layer, forming a gate electrode straddling the gate region of the fin.

2. The method according to claim 1, wherein the reactive radicals in the aqueous solution are hydroxyl (OH) radicals.

3. The method according to claim 1, wherein the reactive radicals in the aqueous solution are radicals with a lifetime less than about 1 second and an oxidation potential greater than about 1.8 volts.

4. The method according to claim 1, further comprising:
applying the aqueous solution to the semiconductor workpiece with the aqueous solution at a temperature less than 100 degrees Celsius.

5. The method according to claim 1, further comprising:
applying the energy to the aqueous solution to generate the reactive radicals with a concentration greater than one part per million (ppm) in the aqueous solution.

6. The method according to claim 1, further comprising:
generating the aqueous solution with ozonated deionized water as the energy receiver.

7. The method according to claim 1, further comprising:
generating the aqueous solution with hydrogen peroxide as the energy receiver.

8. The method according to claim 1, further comprising:
generating the aqueous solution with a concentration of energy receiver that is between 1 part per million (ppm) and 30 percent by mass (wt %).

9. The method according to claim 1, further comprising:
applying the energy to the energy receiver with ultraviolet radiation, sound waves, or infrared radiation.

10. The method according to claim 1, wherein the first etch is a dry etch, and wherein the polymer by-product layer comprises process gas residue from the dry etch.

11. The method according to claim 1, wherein the first etch is a dry etch, and wherein the polymer by-product layer comprises fluorocarbon polymer.

12. The method according to claim 1, further comprising:
performing a semiconductor manufacturing process to form the polymer by-product layer on a silicon, germanium, or group III-V substrate.

13. The method according to claim 1, further comprising:
forming a patterned hard mask layer on the semiconductor workpiece, wherein the first etch is performed with the patterned hard mask layer in place and results in the polymer by-product layer further lining the patterned hard mask layer;

after removing the polymer by-product layer, performing a second etch into the patterned hard mask layer to remove the patterned hard mask layer from the semiconductor workpiece;

forming a dielectric layer covering the semiconductor workpiece; and performing a third etch into the dielectric layer to recess a top surface of the dielectric layer to below a top surface of the fin.

14. A method for removing polymer, the method comprising:
performing a first etch into a semiconductor workpiece, wherein the first etch results in a polymer by-product layer lining the semiconductor workpiece;

generating a fluid with hydroxyl radicals from ozonated deionized water or hydrogen peroxide;

applying the fluid to the semiconductor workpiece to remove the polymer by-product layer from the semiconductor workpiece;

forming a photoresist layer masking a gate region of the semiconductor workpiece;

implanting ions into regions of the semiconductor workpiece unmasked by the photoresist layer to define a pair of source/drain regions, wherein implanting the ions results in an additional polymer by-product layer on the photoresist layer;

applying an additional fluid with hydroxyl radicals to the additional polymer by-product layer to remove the additional polymer by-product layer; and after removing the additional polymer by-product layer, forming a gate electrode covering the gate region of the semiconductor workpiece.

15. The method according to claim 14, wherein the fluid is applied to the semiconductor workpiece at a temperature less than about 100 degrees Celsius and with a concentration of hydroxyl radicals greater than about 1 part per million.

16. The method according to claim 14, wherein applying the fluid to the semiconductor workpiece comprises increasing solubility or wettability of the polymer by-product layer.

17. The method according to claim 14, further comprising:
forming a patterned hard mask layer on the semiconductor workpiece, wherein the first etch is performed with the patterned hard mask layer in place and results in the polymer by-product layer further lining the hard mask layer, and wherein the first etch is performed to form a fin protruding upward from a base of the semiconductor workpiece;

after removing the polymer by-product layer, performing a second etch into the patterned hard mask layer to remove the patterned hard mask layer from the semiconductor workpiece;

forming a dielectric layer covering the semiconductor workpiece; and performing a third etch into the dielectric layer to recess a top surface of the dielectric layer to below a top surface of the fin;

wherein the gate region is in the fin, wherein the source/drain regions are formed in the fin, and wherein the gate electrode is formed straddling the fin.

18. The method according to claim 17, wherein the additional fluid is applied to the additional polymer by-product layer at a temperature less than about 100 degrees Celsius and with a concentration of hydroxyl radicals greater than about 1 part per million, and wherein applying the additional fluid comprises increasing solubility or wettability of the additional polymer by-product layer.

19. A method for manufacturing an integrated circuit, the method comprising:
forming a patterned hard mask layer on a semiconductor substrate;

performing a first etch into the semiconductor substrate to form a fin protruding upward from a base of the semiconductor substrate, wherein the first etch is performed with the patterned hard mask layer in place, and wherein the first etch results in a polymer by-product layer lining the fin and the patterned hard mask layer;

applying a fluid with hydroxyl radicals to the polymer by-product layer to remove the polymer by-product layer;

performing a second etch into the patterned hard mask layer to remove the patterned hard mask layer from the semiconductor substrate;

forming a dielectric layer covering the semiconductor substrate;

performing a third etch into the dielectric layer to recess a top surface of the dielectric layer to below a top surface of the fin;

forming a photoresist layer masking a gate region of the fin;

implanting ions into regions of the fin unmasked by the photoresist layer to define a pair of source/drain regions in the fin, wherein implanting the ions results in an additional polymer by-product layer on the photoresist layer;

applying another fluid with hydroxyl radicals to the additional polymer by-product layer to remove the additional polymer by-product layer; and after removing the additional polymer by-product layer, forming a gate electrode straddling the gate region of the fin.

20. The method according to claim 19, wherein the other fluid is applied to the additional polymer by-product layer at a temperature less than about 100 degrees Celsius and with a concentration of hydroxyl radicals greater than about 1 part per million, and wherein applying the other fluid comprises increasing solubility or wettability of the additional polymer by-product layer.

\* \* \* \* \*